United States Patent
Li et al.

(10) Patent No.: US 9,190,282 B2
(45) Date of Patent: Nov. 17, 2015

(54) HIGH-K DIELECTRIC LAYER BASED SEMICONDUCTOR STRUCTURES AND FABRICATION PROCESS THEREOF

(71) Applicants: Aileen Li, Shanghai (CN); Jinghua Ni, Shanghai (CN)

(72) Inventors: Aileen Li, Shanghai (CN); Jinghua Ni, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 207 days.

(21) Appl. No.: 13/662,535

(22) Filed: Oct. 28, 2012

(65) Prior Publication Data
US 2013/0313658 A1    Nov. 28, 2013

(30) Foreign Application Priority Data
May 24, 2012    (CN) .......................... 2012 1 0164991

(51) Int. Cl.
*H01L 21/8242* (2006.01)
*H01L 21/28* (2006.01)
*H01L 29/51* (2006.01)
*H01L 29/78* (2006.01)

(52) U.S. Cl.
CPC ........ *H01L 21/28202* (2013.01); *H01L 29/518* (2013.01); *H01L 29/78* (2013.01)

(58) Field of Classification Search
CPC ................................................ H01L 21/02181
USPC .......................... 438/240, 287, 197, 165, 151; 257/E21.468, E21.19
See application file for complete search history.

(56) References Cited

U.S. PATENT DOCUMENTS

| | | | |
|---|---|---|---|
| 6,703,277 B1 * | 3/2004 | Paton et al. | 438/287 |
| 6,787,440 B2 * | 9/2004 | Lindert et al. | 438/591 |
| 8,021,824 B2 | 9/2011 | Iwashita et al. | |
| 8,518,783 B2 * | 8/2013 | Mueller et al. | 438/287 |
| 2005/0059259 A1 * | 3/2005 | O'Meara et al. | 438/765 |
| 2011/0037131 A1 | 2/2011 | Mueller et al. | |
| 2013/0052814 A1 * | 2/2013 | Clark | 438/591 |

\* cited by examiner

*Primary Examiner* — Julia Slutsker
(74) *Attorney, Agent, or Firm* — Anova Law Group, PLLC

(57) ABSTRACT

A method is disclosed for fabricating a semiconductor structure. The method includes providing a semiconductor substrate, forming a first dielectric layer on a surface of the semiconductor substrate based on a first-type oxidation, and forming a high-K dielectric layer on a surface of the first dielectric layer. The method also includes performing a first thermal annealing process to remove the first dielectric layer between the semiconductor substrate and the high-K dielectric layer such that the high-K dielectric layer is on the surface of the semiconductor substrate. Further, the method includes performing a second thermal annealing process to form a second dielectric layer on the surface of the semiconductor substrate between the semiconductor substrate and the high-K dielectric layer, based on a second-type oxidation different from the first-type oxidation, such that high-K dielectric layer is on the second dielectric layer instead of the first dielectric layer.

11 Claims, 4 Drawing Sheets

HIGH-K DIELECTRIC LAYER BASED SEMICONDUCTOR STRUCTURES AND FABRICATION PROCESS THEREOF

CROSS-REFERENCES TO RELATED APPLICATIONS

This application claims the priority of Chinese patent application no. CN201210164991.8, filed on May 24, 2012, the entire contents of which are incorporated herein by reference.

FIELD OF THE INVENTION

The present invention relates to the field of semiconductor manufacturing technology and, more particularly, relates to techniques for fabricating high-K dielectric layer based semiconductor devices and transistors.

BACKGROUND

With rapid development on integrated circuit (IC) manufacturing technology, size of semiconductor devices in ICs, especially the size of MOS (Metal Oxide Semiconductor) devices, continues to shrink in order to meet the requirements for miniaturization and high-degree-integration of integrated circuits. As the size of the MOS transistor devices decreases continuously, the existing fabrication technology, which uses silicon oxide or silicon oxynitride as the gate dielectric layer, has been challenged. More specifically, transistors with silicon oxide or silicon oxynitride based gate dielectric layer may have certain problems, such as increased leakage current and impurity diffusion, which may affect the threshold voltage of the transistors. Thus, the performance of semiconductor devices based on such transistors may be impacted.

To solve these problems, transistors with high dielectric constant (high-K) metal gate structures have been introduced. By replacing the silicon oxide or silicon oxynitride gate dielectric materials with high-K materials, the leakage current can be reduced while the size of the semiconductor devices decreases and the performance of the semiconductor devices can be improved.

However, in semiconductor structures with high-K dielectric layer created by current fabrication processes, the high-K dielectric layers and the other dielectric layers often have defects and poor quality, causing poor performance in the later formed transistors. The disclosed methods and systems are directed to solve one or more problems set forth above and other problems.

BRIEF SUMMARY OF THE DISCLOSURE

One aspect of the present disclosure includes a method for fabricating a semiconductor structure. The method includes providing a semiconductor substrate, forming a first dielectric layer on a surface of the semiconductor substrate based on a first-type oxidation, and forming a high-K dielectric layer on a surface of the first dielectric layer. The method also includes performing a first thermal annealing process to remove the first dielectric layer between the semiconductor substrate and the high-K dielectric layer such that the high-K dielectric layer is on the surface of the semiconductor substrate. Further, the method includes performing a second thermal annealing process to form a second dielectric layer on the surface of the semiconductor substrate between the semiconductor substrate and the high-K dielectric layer, based on a second-type oxidation different from the first-type oxidation, such that high-K dielectric layer is on the second dielectric layer instead of the first dielectric layer.

Another aspect of the present disclosure includes a semiconductor structure. The semiconductor structure includes a semiconductor substrate and a gate structure. The gate structure is formed on the semiconductor substrate by: forming a first dielectric layer on a surface of the semiconductor substrate based on a chemical oxidation process; forming a high-K dielectric layer on a surface of the first dielectric layer; performing a first thermal annealing process to remove the first dielectric layer between the semiconductor substrate and the high-K dielectric layer such that the high-K dielectric layer is on the surface of the semiconductor substrate; performing a second thermal annealing process to form a second dielectric layer on the surface of the semiconductor substrate between the semiconductor substrate and the high-K dielectric layer such that high-K dielectric layer is on the second dielectric layer instead of the first dielectric layer; forming a gate electrode layer on the high-K dielectric layer; and etching the high-K dielectric layer and the second dielectric layer using the gate electrode layer as a mask to form the gate structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
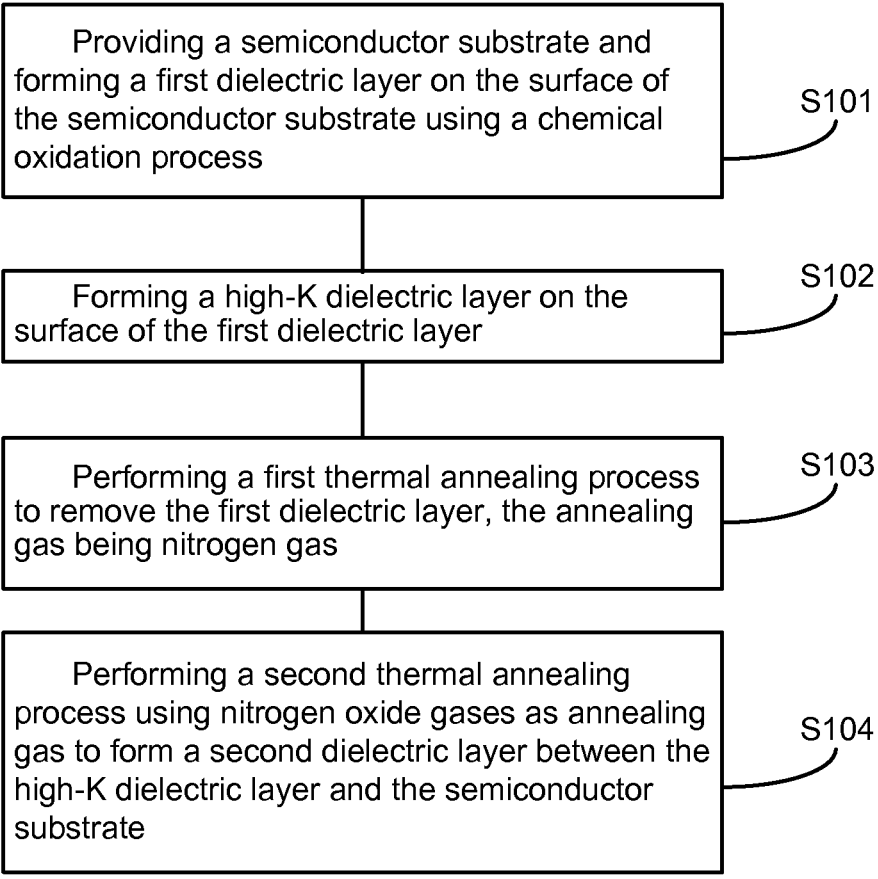
FIG. 1 illustrates an exemplary fabrication process of a semiconductor device consistent with the disclosed embodiments.

FIG. 1 illustrates an exemplary fabrication process S10 of a semiconductor device, and FIGS. 2-5 illustrate exemplary semiconductor structures forming a semiconductor device 10 corresponding to various stages of the fabrication process S10.

As shown in FIG. 1, at the beginning of the fabrication process, a semiconductor substrate is provided, and a first dielectric layer is formed on the surface of the semiconductor substrate by using a chemical oxidation process (S101).

Figure 2:
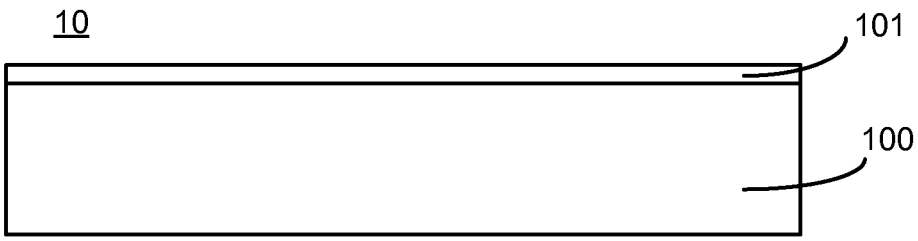
FIGS. 2-5 illustrate exemplary semiconductor structures corresponding to certain stages of the fabrication process consistent with the disclosed embodiments.

FIG. 2 shows a corresponding semiconductor device 10. As shown in FIG. 2, a semiconductor substrate 100 is provided as the base for the semiconductor device 10. The semiconductor substrate 100 may be made of any appropriate type of semiconductor material, such as silicon, silicon germanium, silicon carbide, silicon on insulator, etc. Other materials may also be used. The semiconductor substrate 100 also provides a base for subsequent processes and structures.

Also as shown in FIG. 2, a first dielectric layer 101 is formed on top of the semiconductor substrate 100 by using a chemical oxidation process. The first dielectric layer 101 may be made of silicon oxide, and ozone ($O_3$) may be used in the chemical oxidation process. For example, under room temperature, the semiconductor substrate 100 may be submerged in an ozone water solution. The mass per volume concentration of ozone in water may be in the range of approximately 1-100 ppm. In the ozone-water solution, the silicon on the surface of the semiconductor substrate 100 is oxidized to form silicon oxide.

In the chemical oxidation process, when forming the silicon oxide of the first dielectric layer 101, a substantial number of hydroxyls (OH) are also generated on the surface of the first dielectric layer 101 due to the reactions among ozone, water, and silicon. The hydroxyls generated on the surface of the first dielectric layer 101 may benefit the growth and crystallization of the high-K dielectric layer formed by subsequent processes. The existence of the hydroxyls may lead to a more symmetric crystalline layout in the high-K dielectric layer, thus-formed high-K dielectric layer is more compact or dense and with fewer defects. However, as an interface layer for the high-K dielectric layer, the first dielectric layer 100 formed by the chemical oxidation process may itself have certain defects, which may have adverse impact the performance and reliability of the later-formed transistor.

Figure 3:
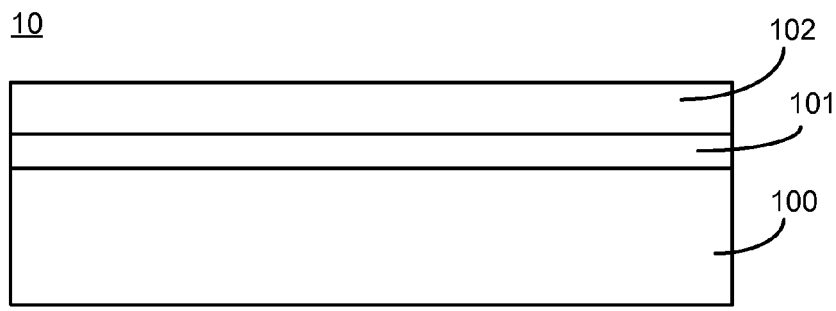

Returning to FIG. 1, after the semiconductor substrate 100 is provided and the first dielectric layer 101 is formed (S101), a high-K dielectric layer may be formed on the surface of the first dielectric layer 101 (S102). FIG. 3 shows a corresponding semiconductor device 10.

As shown in FIG. 3, a high-K dielectric layer 102 is formed on the surface of the first dielectric layer 101. The high-K dielectric layer 102 may be made of any appropriate materials with high K value, such as hafnium silicon oxide, nitrogen hafnium silicon oxide, nitrogen hafnium tantalum oxide, hafnium oxide, zirconium oxide, hafnium oxide silicon, lanthanum oxide, zirconium oxide silicon, titanium oxide, tantalum oxide, barium strontium oxide titanium, barium oxide titanium, strontium oxide titanium, and aluminum oxide or any combination thereof. Other materials may also be used. The high-K dielectric layer 102 may have desired thermal stability and mechanical strength, may reduce carrier diffusion, and may further reduce leakage current of the later-formed transistor.

Further, the high-K dielectric layer 102 may be formed by using a chemical vapor deposition (CVD) process or a single atomic layer deposition (ALD) process. Other processes may also be used. The thickness or depth of the high-K dielectric layer 102 may be approximately 5~30 Å, such that it may be difficult for carriers to pass through the high-K dielectric layer 102 and the carrier diffusion can be prevented.

The first dielectric layer 101 is formed through the preceding chemical oxidation process and may be less dense and contain more defects, but more hydroxyls are generated on the surface of the dielectric layer 101, which promote the growth and crystallization of the high-K dielectric layer 102, lead to a denser high-K dielectric layer with less defects, and thus improve the performance of the semiconductor device 10.

That is, the high-K dielectric layer 102 is formed on the surface of the first dielectric layer 101 having the hydroxyls. Thus, when forming the high-K dielectric layer 102, the hydroxyls can promote the growth and crystallization of the high-K dielectric layer 102, reduce internal defects of the high-K dielectric layer 102, and lead to a more symmetric or well-aligned crystalline layout in the high-K dielectric layer 102. Thus, the high-K dielectric layer 102 is denser and with better quality, which may further reduce the carrier diffusion in the later-formed semiconductor device and reduce the leak current. However, the first dielectric layer 101 may need to be removed and replaced by a denser dielectric layer with fewer defects.

Figure 4:
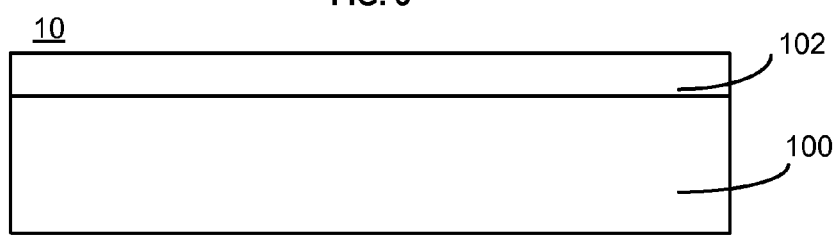

A first thermal annealing process is performed on the semiconductor substrate 100 to remove the first dielectric layer 101 using nitrogen gas for the first thermal annealing process (S103). FIG. 4 shows a corresponding semiconductor device 10.

As shown in FIG. 4, the first dielectric layer 101 is removed after the thermal annealing process. The thermal annealing process may be performed in various ways. For example, a furnace annealing process or a rapid thermal anneal (RTA) may be performed. The first annealing process may use nitrogen as the annealing gas and the annealing temperature may be set to at least approximately 1000° C. The annealing time may be set to a range of approximately 1 second to 180 seconds, and the pressure is set to approximately 0.01~0.1 Torr. Other temperature, pressure, and/or time periods may also be used.

More particularly, in certain embodiments, the semiconductor substrate 100 with the high-K dielectric layer 102 may be placed in an annealing furnace. The annealing furnace is filled with nitrogen gas as the annealing gas. The annealing temperature of the annealing furnace is controlled at above 1000° C. The semiconductor substrate 100 is annealed with the pressure ranging from 0.01 to 0.1 Torr for approximately 1 second to 180 seconds.

The size of a nitrogen molecule is smaller than the interatomic distance of the lattice (i.e., lattice cell length) in the high-K dielectric layer 102. Thus, during the thermal annealing process, the nitrogen molecules can diffuse and pass through the high-K dielectric layer 102 and then contact with the surface of the first dielectric layer 101. The annealing temperature used in the first annealing process is set to a sufficient high degree such that the silicon oxide in the first dielectric layer 101 may be decomposed and then may react with the nitrogen molecules passing through the high-K dielectric layer 102 to generate nitrogen oxides and silicon. The generated silicon may become part of or integrate into the semiconductor substrate 100.

Further, the size of the nitrogen oxide molecule is also less than the lattice cell length in the high-K dielectric layer 102. With the relatively high annealing temperature, the generated nitrogen oxide may diffuse into the high-K dielectric layer 102. In addition, because the annealing pressure is relative low, the nitrogen oxide in the high-K dielectric layer 102 may pass through the high-K dielectric layer 102 and discharge into the annealing environment as a gaseous substance. In such way, the first dielectric layer 101 may be decomposed and removed between the high-K dielectric layer 102 and semiconductor substrate 100, and the high-K dielectric layer 102 directly contacts with the surface of the semiconductor substrate 100.

Figure 5:
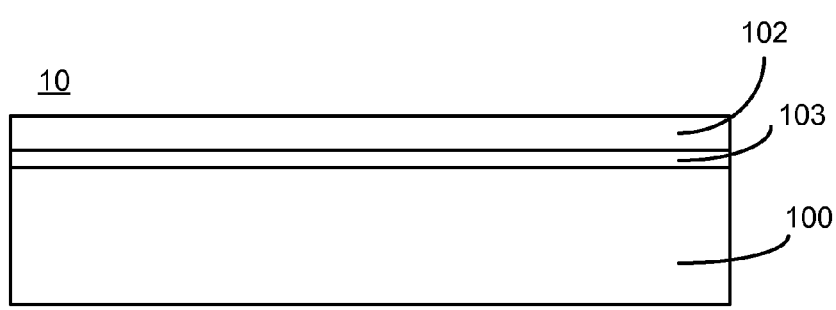

Return to FIG. 1, after the first thermal annealing process is performed on the semiconductor substrate 100 and the first dielectric layer is removed (S103), a second thermal annealing process is performed on semiconductor substrate 100 using nitrogen oxide as the annealing gas to form a second dielectric layer between the high-K dielectric layer 102 and the semiconductor substrate 100 (S104). FIG. 5 shows a corresponding semiconductor device 10.

As shown in FIG. 5, the second dielectric layer 103 is formed between the high-K dielectric layer 102 and the semiconductor substrate 100 after the second annealing process. The second dielectric layer 103 may be made of silicon oxynitride, and may have a thickness of approximately 5~15 nm.

The annealing temperature for the second annealing process may be set to a range of approximately 300° C.~1200° C., and the thermal annealing time may be set to a range of approximately 1 second to 180 seconds. The annealing gas may a nitrogen oxide ($N_xO_y$) gas including NO, $N_2O$, $N_2O_3$, $N_2O_5$, $NO_2$, or any combination thereof. Other annealing parameters or gases may also be used.

During the second thermal annealing process, since the molecular size of the nitrogen oxide gas is smaller than the unit cell length of the crystal lattices in the high-K dielectric layer 102, the nitrogen oxide molecules can diffuse into the high-K dielectric layer 102 and pass through the high-K dielectric layer 102 to be in contact with the semiconductor substrate 100. The heated nitrogen oxide molecules react with the silicon on the surface of the semiconductor substrate 100 to form a layer of silicon oxynitride, i.e., the second dielectric layer 103.

Further, because the second dielectric layer 103 is formed in a high temperature environment based on the reaction between the nitrogen oxide gases and the silicon, the generated silicon oxynitride on the semiconductor substrate 100 may migrate and fill the defects within the second dielectric layer 103. That is, a thermal oxidation process or equivalent is used to form the second dielectric layer 103. Thus, the formed second dielectric layer 103 is more compact or dense and has good quality. In addition, the carriers in the subsequently formed semiconductor device may be unable to diffuse, and the leakage current can be reduced and the transistor performance can be improved.

Thus, by forming the high-K dielectric layer 102 on the surface of the first dielectric layer 101 formed by a chemical oxidation process, the high-K dielectric layer 102 can have substantially less defects and denser formation due to the effect of the hydroxyls on the surface of the first dielectric layer 101. Further, after the high-K dielectric layer 102 is formed, the first thermal annealing process is performed to remove the first dielectric layer 101, and the second thermal annealing process is performed to form the second dielectric layer 103 between the high-K dielectric layer 102 and the semiconductor substrate 100. The second dielectric layer 103 is formed by thermal oxidization under high temperature and, thus, has less defects and denser formation. Therefore, both the high-K dielectric layer 102 and second dielectric layer 103 are denser and have better quality. Carrier diffusion in the subsequently-formed semiconductor device can be reduced, the leakage current is also reduced, and the device performance is improved.

Figure 6:
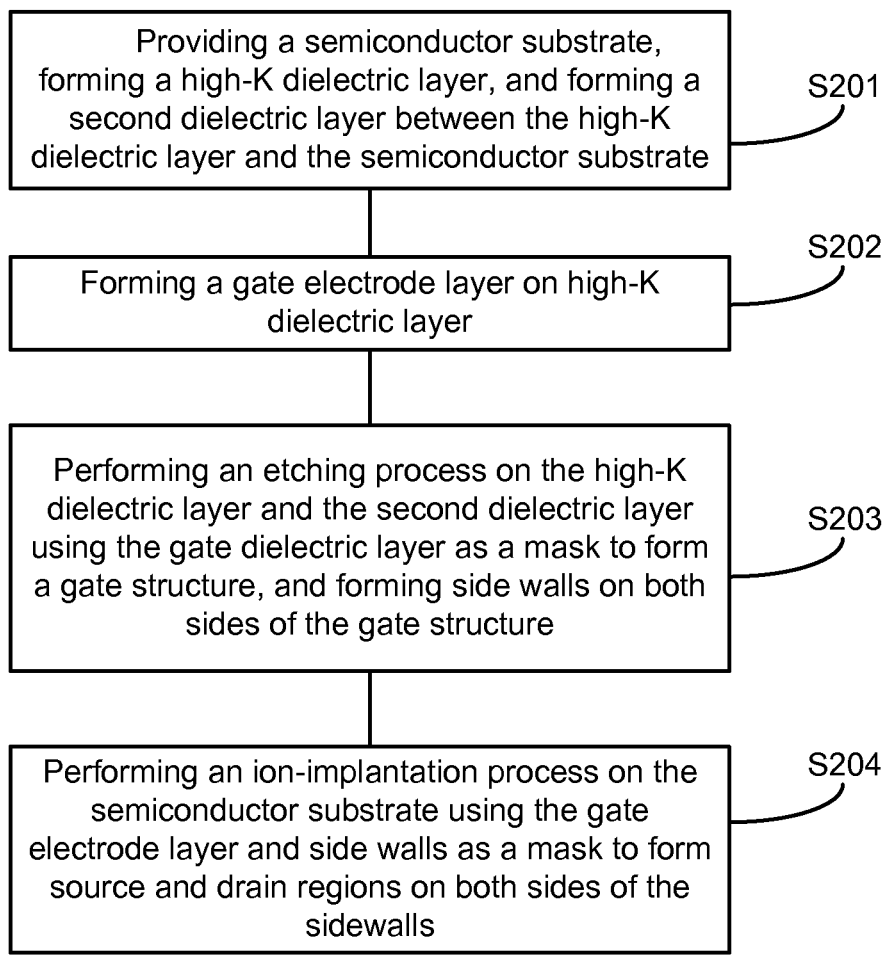
FIG. 6 illustrates another exemplary fabrication process of a semiconductor device consistent with the disclosed embodiments.
Figure 7:
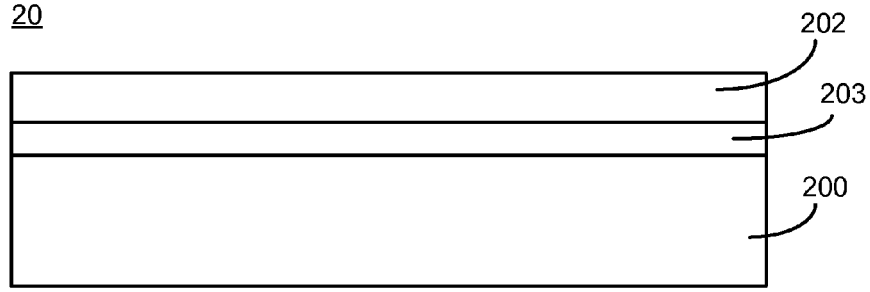
FIGS. 7-9 illustrate exemplary semiconductor structures corresponding to certain stages of the fabrication process consistent with the disclosed embodiments.
Figure 8:
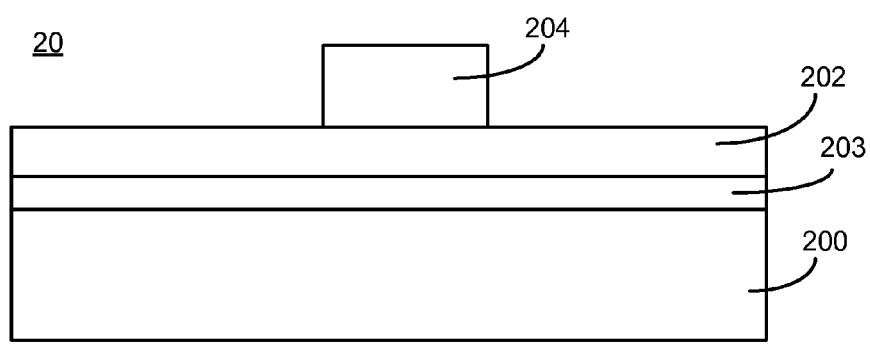
Figure 9:
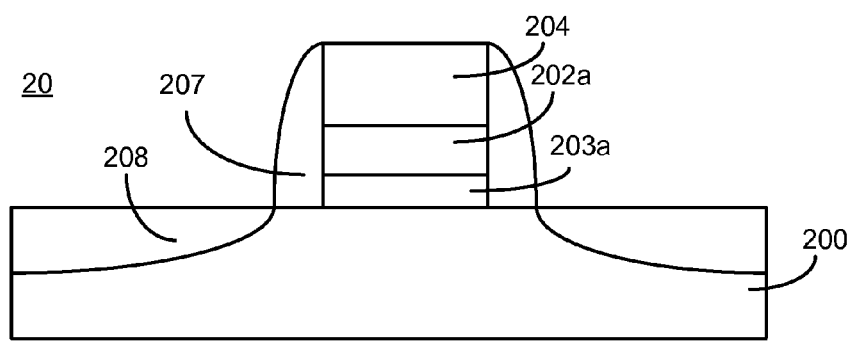

FIG. 6 illustrates another exemplary fabrication process S20 of a semiconductor device 20, and FIGS. 7-9 illustrate exemplary semiconductor structures forming the semiconductor device 20 corresponding to various stages of the fabrication process S20.

As shown in FIG. 6, similar to the processes described above, at the beginning of the fabrication process S20, a semiconductor substrate is provided, a high-K dielectric layer is formed, and a second dielectric layer is formed between the high-K dielectric layer and the semiconductor substrate (S201). FIG. 7 shows a corresponding semiconductor device 20.

As shown in FIG. 7, similar to FIGS. 2-5, a semiconductor substrate 200 is provided, and a first dielectric layer (not shown) is first formed on the surface of the semiconductor substrate 200. A high-K dielectric layer 202 is then formed on the surface of the first dielectric layer.

Similarly, after high-K dielectric layer 202 is formed, a first thermal annealing process is performed to remove the first dielectric layer. Further, a second annealing process is performed to form the second dielectric layer 203 between the high-K dielectric layer 202 and the semiconductor substrate 200. Detailed descriptions are omitted due to the similarity.

Returning to FIG. 6, after the formation of the second dielectric layer 203, a gate electrode layer is formed on high-K dielectric layer 202 (S202). FIG. 8 shows a corresponding semiconductor device 20.

As shown in FIG. 8, a gate electrode layer 204 is formed on the surface of the high-K dielectric layer 202. The gate electrode layer 204 may be made of metal, such as aluminum, copper, silver, gold, platinum, nickel, titanium, cobalt, thallium, tantalum or tungsten. Other materials may also be used.

The gate electrode layer 204 may be formed by a various processes. For example, a gate last process may be used to form the gate electrode layer 204. More particularly, before the formation of the gate electrode layer 204, a dummy gate electrode layer (not shown) may be formed on the surface of the high-K dielectric layer 202. The dummy gate electrode layer may be made of polycrystalline silicon or polysilicon. The dummy gate electrode layer may be etched using the gate pattern as a mask to form a gate opening exposing the high-K dielectric layer 202. Further, the gate metal is filled in the gate opening to form the gate electrode layer 204.

Alternatively, the gate electrode layer 204 may be formed by first forming a metal layer (not shown) on the surface of high-K dielectric layer 202. The metal layer is then etched to form the gate electrode layer 204.

Further, additionally or optionally, before the gate electrode layer 204 is formed, a protective layer (not shown) may be formed on the surface of the high-K dielectric layer 202. The protective layer may be made of materials such as titanium nitride, thallium nitride, tungsten nitride, aluminum oxide, or any combination thereof. The material forming the protective layer may be different from that of the high-K dielectric layer 202. The protective layer may be used to protect the surface of the high-K dielectric layer 202 such that the surface of the high-K dielectric layer 202 is not damaged in the process of forming the gate electrode layer 204. Further, the protective layer also make it more difficult for carriers to pass through the high-K dielectric layer 202, and the leakage current can be further suppressed.

Returning to FIG. 6, after the formation of the gate electrode layer 204, an etching process is performed on the high-K dielectric layer 202 and the second dielectric layer 203 (S203). FIG. 9 shows a corresponding semiconductor device 20.

As shown in FIG. 9, the high-K dielectric layer 202 and the second dielectric layer 203 are etched using the gate dielectric layer 204 as a mask to form remaining high-K dielectric layer 202a and second dielectric layer 203a. That is, except the regions covered by the gate mask, the etching process may remove all the remaining high-K gate dielectric layer 202 and second dielectric layer 203 until the semiconductor substrate 200 is exposed. The etching methods for forming the above high-K gate dielectric layer 202 and second dielectric layer 203 may include dry etching or wet etching. In one embodiment, the etching process may be an anisotropic dry etching process.

Further, side walls 207 are formed on both sides of the gate electrode layer 204, high-K dielectric layer 202a, second dielectric layer 203a, and portions of semiconductor substrate 200. The side walls 207 may be made of silicon oxide, silicon nitride, or silicon oxynitride, etc., and may be formed by any appropriate process. For example, a deposition process may be performed to form a side wall layer (not shown) on top and/or side surfaces of the semiconductor substrate 200, the gate electrode layer 204, the high-K gate dielectric layer 202a, and the second dielectric layer 203a. An etchback process may then be used to form the side walls 207 on sides of the gate structure (i.e., the gate electrode layer 204, the high-K gate dielectric layer 202a, and the second dielectric layer 203a) and on the portions of the semiconductor substrate 200 from both sides of the gate electrode layer 204.

Returning to FIG. 6, after the gate structure is formed on the semiconductor substrate 200 (S203), a source region and a drain region are formed in the substrate on both sides of the side walls 207 (S204). FIG. 9 shows a corresponding semiconductor device 20.

As shown in FIG. 9, source and drain regions 208 are formed in the semiconductor substrate 200 from both sides of the gate structure and the side walls 207. The source and drain regions 208 may be formed by any appropriate processes. For example, the source and drain regions 208 may be formed by an ion-implantation process on the semiconductor substrate 200 using the gate electrode layer 204 and side walls 207 as a mask on both sides of the sidewalls 207. Other fabrication processes may also be included.

The semiconductor device 20 may be a p-type transistor or n-type transistor. To make a p-type transistor, an n-well doping process may be first performed on corresponding regions of the semiconductor substrate 200, and an ion-implantation process is then performed using the gate electrode layer 204 and side walls 207 as a mask to implant p-type ions to form the source and drain regions 208. The p-type ions may include any appropriate ions, such as boron ions and/or indium ions.

On the other hand, to make an n-type transistor, a p-well doping process may be first performed on corresponding regions of the semiconductor substrate 200, and an ion-implantation process is then performed using the gate electrode layer 204 and side walls 207 as a mask to implant n-type ions to form the source and drain regions 208. The n-type ions may include any appropriate ions, such as phosphate ions and/or arsenic ions.

Therefore, a transistor may be formed accordingly. Because the high-K dielectric layer 202a and the second dielectric layer 203a are denser and have less internal defects, it is more difficult for carriers to diffuse into or pass through the high-K dielectric layer 202a and the second dielectric layer 203a. Thus, the transistor can have a reduced leakage current, stable bias temperature, and improved device performance.

By using the disclosed structures and methods, high performance semiconductor structures and transistors may be fabricated. A transit first dielectric layer is formed first by a chemical oxidation process and the high-K dielectric layer is formed on the surface of the first dielectric layer 101. A substantial number of hydroxyls are generated on the surface of the first dielectric layer by the chemical oxidation process, and the high-K dielectric layer can have substantially less defects and denser formation due to the effect of the hydroxyls on the surface of the first dielectric layer. Such desired characteristics of the high-K dielectric layer may be difficult to obtain from an interface dielectric layer formed by a thermal oxidation process.

Further, after the high-K dielectric layer is formed, a first thermal annealing process is performed to remove the first dielectric layer by decomposing the first dielectric layer without damaging the high-K dielectric layer. A second thermal annealing process is then performed to form the second dielectric layer between the high-K dielectric layer and the semiconductor substrate. The second dielectric layer is formed by nitrification and/or oxidization under high temperature, i.e., a thermal oxidation or similar process. Thus, the second dielectric layer has less defects and denser formation to be an interface layer for the high-K dielectric layer. Therefore, both the high-K dielectric layer and second dielectric layer are denser and have better quality. Carrier diffusion in the semiconductor device or transistor is reduced, the leakage current is also reduced, and the device performance is improved. Other applications, advantages, alternations, modifications, or equivalents to the disclosed embodiments are obvious to those skilled in the art.

What is claimed is:

1. A method for fabricating a semiconductor structure, comprising:
   providing a semiconductor substrate;
   forming a first dielectric layer on a surface of the semiconductor substrate based on a first-type oxidation;
   forming a high-K dielectric layer on a surface of the first dielectric layer;
   performing a first thermal annealing process to remove the first dielectric layer between the semiconductor substrate and the high-K dielectric layer, wherein the first thermal annealing process decomposes the first dielectric layer by reacting with a thermal annealing gas nitrogen that passes through the high-K dielectric layer to produce silicon and a gaseous product of nitride oxide (NxOy), the silicon being integrated into the semiconductor substrate to provide an integrated semiconductor substrate, such that the high-K dielectric layer is directly on a surface of the integrated semiconductor substrate; and
   while the high-K dielectric layer is on the integrated semiconductor substrate, performing a second thermal annealing process to treat the surface of the integrated semiconductor substrate to form a second dielectric layer between a remaining portion of the integrated semiconductor substrate and the high-K dielectric layer, based on a second-type oxidation different from the first-type oxidation, such that the high-K dielectric layer is on the second dielectric layer instead of the first dielectric layer.

2. The method according to claim 1, wherein:
   the first-type oxidation is a chemical oxidation process; and
   the second-type oxidation is a thermal oxidation.

3. The method according to claim 1, wherein:
   the high-K dielectric layer is formed on the surface of the first dielectric layer that has a substance including hydroxyls, obtained from the first-type oxidation and prepared for forming the high-K dielectric layer with dense crystallization on the first dielectric layer.

4. The method according to claim 1, wherein:
   the second annealing process for forming the second dielectric layer is performed using nitrogen oxide gases as a thermal annealing gas for the second-type oxidation.

5. The method according to claim 1, wherein:
   wherein the silicon integrated semiconductor substrate is used as a part of the semiconductor substrate.

6. The method according to claim 1, wherein:
   the second dielectric layer is formed by using the nitrogen oxide gases to thermally oxidize the surface of the integrated semiconductor substrate through the high-K dielectric layer to form a silicon oxynitride layer on the remaining portion of the integrated semiconductor substrate.

7. The method according to claim 1, further including:
   forming a gate electrode layer on the high-K gate dielectric layer;

etching the high-K dielectric layer and the second dielectric layer using the gate electrode layer as a mask to form a gate structure;
forming side walls on both sides of the gate structure; and
forming source and drain regions in the semiconductor substrate on two adjacent sides of the gate structure.

8. The method according to claim 2, wherein:
the first dielectric layer on the surface of the semiconductor substrate is made of silicon oxide; and
reactants used in the chemical oxidation process are ozone and water, and a mass per volume concentration of ozone in the water ranges from 1 ppm to 100 ppm.

9. The method according to claim 1, wherein:
the high-K dielectric layer is made of one or more of hafnium silicon oxide, nitrogen hafnium silicon oxide, nitrogen hafnium tantalum oxide, hafnium oxide, zirconium oxide, hafnium oxide silicon, lanthanum oxide, zirconium oxide silicon, titanium oxide, tantalum oxide, barium strontium oxide titanium, barium oxide titanium, strontium oxide titanium, and aluminum oxide.

10. The method according to claim 1, wherein:
the thickness of the high-K dielectric layer is 5 Å-30 Å.

11. The method according to claim 1, wherein:
the thickness of the second dielectric layer is 5 nm-15 nm.

* * * * *